United States Patent
Ye et al.

(10) Patent No.: US 11,050,242 B2
(45) Date of Patent: Jun. 29, 2021

(54) DRIVER FOR POWER DEVICE

(71) Applicant: SHENZHENSHI PENGYUAN ELECTRONICS CO., LTD., Shenzhen (CN)

(72) Inventors: Chunxian Ye, Shenzhen (CN); Xubiao Zhan, Shenzhen (CN); Tao Li, Shenzhen (CN); Shengchao Ruan, Shenzhen (CN); Wenbo Chen, Shenzhen (CN)

(73) Assignee: SHENZHENSHI PENGYUAN ELECTRONICS CO., LTD., Shenzhen (CN)

( * ) Notice: Subject to any disclaimer, the term of this patent is extended or adjusted under 35 U.S.C. 154(b) by 120 days.

(21) Appl. No.: 16/486,927

(22) PCT Filed: Oct. 13, 2017

(86) PCT No.: PCT/CN2017/106157
§ 371 (c)(1),
(2) Date: Aug. 19, 2019

(87) PCT Pub. No.: WO2019/051917
PCT Pub. Date: Mar. 21, 2019

(65) Prior Publication Data
US 2020/0014195 A1 Jan. 9, 2020

(30) Foreign Application Priority Data

Sep. 13, 2017 (CN) .......................... 201710823715.0
Sep. 13, 2017 (CN) .......................... 201721181575.3

(51) Int. Cl.
*H02H 7/20* (2006.01)
*H02H 7/12* (2006.01)
(Continued)

(52) U.S. Cl.
CPC ............ *H02H 7/20* (2013.01); *H02H 7/1213* (2013.01); *H02M 1/08* (2013.01); *H02M 1/32* (2013.01);
(Continued)

(58) Field of Classification Search
CPC .......... H02H 3/08; H02H 3/24; H02H 7/1213; H02H 5/04; H02H 7/20; H02H 7/222;
(Continued)

(56) References Cited

U.S. PATENT DOCUMENTS 5,424,897 A * 6/1995 Mietus ............... H03K 17/0826
361/103
5,818,670 A * 10/1998 Ahn ....................... H02H 7/122
361/18

(Continued)

FOREIGN PATENT DOCUMENTS

| CN | 102751970 A | 10/2012 |
|---|---|---|
| CN | 202856609 U | 4/2013 |
| CN | 103944549 A | 7/2014 |

OTHER PUBLICATIONS

International Search Report dated Jun. 20, 2018 in corresponding International Application No. PCT/CN2017/106157; 4 pages.

*Primary Examiner* — Matthew V Nguyen
(74) *Attorney, Agent, or Firm* — Maier & Maier, PLLC

(57) ABSTRACT

A driver for a power device. The driver includes: a voltage providing module, configured to provide a voltage required for the power device; a drive signal isolation module, including a signal input end and a signal output end isolated with each other, the signal input end being configured to receive an external drive signal, and the signal output end being connected to a control end of the power device and configured to provide an isolation drive signal for the power device; a short circuit/overcurrent protection module, connected to a drain electrode of the power device, and con-
(Continued)

figured to cut off the power device when a short circuit or an overcurrent occurs for the power device. The driver also includes a Miller clamp module, an under-voltage protection module and an over-temperature protection module.

5 Claims, 5 Drawing Sheets

(51) Int. Cl.
| | |
|---|---|
| *H02M 1/08* | (2006.01) |
| *H02M 1/32* | (2007.01) |
| *H03K 17/08* | (2006.01) |
| *H03K 17/567* | (2006.01) |
| *H03K 17/687* | (2006.01) |
| *H05K 7/20* | (2006.01) |

(52) U.S. Cl.
CPC ............ *H03K 17/08* (2013.01); *H03K 17/567* (2013.01); *H03K 17/687* (2013.01); *H05K 7/20* (2013.01)

(58) Field of Classification Search
CPC .... H02M 2001/327; H02M 1/08; H02M 1/32; H02M 1/44; H03K 17/08; H03K 2017/0806; H03K 17/08122; H03K 17/163; H03K 17/567; H03K 17/687; H03K 7/20
See application file for complete search history.

(56) References Cited

U.S. PATENT DOCUMENTS

| | | | |
|---|---|---|---|
| 6,185,082 B1* | 2/2001 | Yang | ........................ H02M 1/32 323/285 |
| 2018/0248543 A1* | 8/2018 | Senda | ..................... H02M 1/32 |

* cited by examiner

DRIVER FOR POWER DEVICE

CROSS REFERENCE TO RELATED APPLICATION

This application is a US national phase application of International Application No. PCT/CN2017/106157, filed on Oct. 13, 2017, which is based upon and claims a priority to Chinese Patent Application No. 201710823715.0, filed with the State Intellectual Property Office of P. R. China on Sep. 13, 2017, entitled "Driver For Power Device", and is based upon and claims a priority to Chinese Patent Application No. 201721181575.3, filed with the State Intellectual Property Office of P. R. China on Sep. 13, 2017, named "Driver For Power Device", the entire contents of which are incorporated herein by reference.

FIELD

The present disclosure relates to a field of semiconductor technology, and more particularly to a driver for a power device.

BACKGROUND

As a wide band-gap semiconductor device, a SiC/GaN transistor has characteristics such as a high saturation electron drift velocity, a high electric field breakdown strength, a low dielectric constant and a high thermal conductivity. The SiC/GaN transistor has a high blocking voltage, a high operating frequency and a high temperature resistance, and also has a low on-state resistance and a small switching loss. Application of the SiC/GaN transistor is a trend of power density improvement and efficiency improvement at high frequency and high voltage applications.

SUMMARY

To this end, embodiments the present disclosure aim to provide a driver for a power device.

The technical solution in the present disclosure is implemented in a following manner.

A driver for a power device is provided. The driver may include: a voltage providing module, configured to provide a voltage required for the power device; a drive signal isolation module, including a signal input end and a signal output end isolated with each other, the signal input end being configured to receive an external drive signal, and the signal output end being connected to a control end of the power device and configured to provide an isolation drive signal for the power device; a short circuit/overcurrent protection module, connected to a drain electrode of the power device, and configured to cut off the power device when at least one of a short circuit or an overcurrent occurs for the power device; a miller clamp module, connected to a drive end of the power device, and configured to remove Miller effect; an under-voltage protection module, connected to a node between the drive signal isolation module and the power device, and configured to cut off an input of the isolation drive signal to the power device when an input voltage is under voltage; and an over-temperature protection module, connected to the node between the drive signal isolation module and the power device, and configured to cut off the input of the isolation drive signal to the power device selectively according to a temperature of the driver.

BRIEF DESCRIPTION OF THE DRAWINGS

Accompanying drawings which form a part of the present disclosure are used to provide a further understanding of the present disclosure. Exemplary embodiments and illumination in the present disclosure are used to explain the present disclosure, which is not construed to limit the present disclosure. In the accompanying drawings:

FIG. 4-1 is a time waveform diagram illustrating switching on an output of a driver according to a detailed embodiment of the present disclosure;

FIG. 4-2 is a time waveform diagram illustrating cutting off an output of a driver according to a detailed embodiment of the present disclosure;

FIG. 7-1 is a waveform diagram in over-temperature protection according to a detailed embodiment of the present disclosure; and FIG. 7-2 is a thermal imager test pattern in temperature protection according to a detailed embodiment of the present disclosure.

Figure 1:
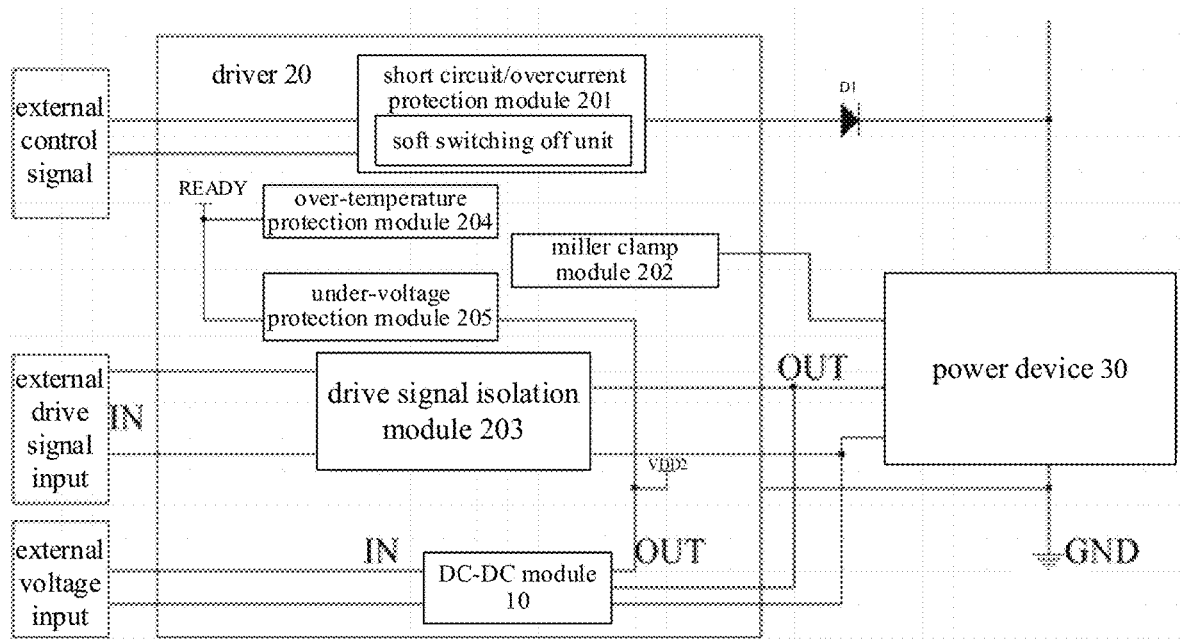
FIG. 1 is a block diagram illustrating a driver according to an embodiment of the present disclosure.

Reference numerals: a DC-DC module 10, a driver 20, a power device 30, a short circuit/overcurrent protection module 201, a miller clamp module 202, a drive signal isolation module 203, an over-temperature protection module 204, and an under-voltage protection module 205.

DETAILED DESCRIPTION

It should be noted that, embodiments in the present disclosure and characteristics in the embodiments can be mutually combined under the condition of no contradiction.

In the description of the present disclosure, it should be noted that, unless specified or limited otherwise, the terms "mounted," "connected," and "coupled" and variations should be understood broadly, such as fixed, demountable, or integral mountings, connections and couplings; and also be mechanical or electrical mountings, connections and couplings; and also can be direct mountings, connections, and couplings, and also can be indirect mountings, connections, and couplings via a media; also can be inner mountings, connections and couplings of two components. Those skilled in the art can understand a specific meaning of the above terms in the present disclosure according to a specific case.

In the related arts, a device applying the transistor may be required to have following characteristics.

1. For meeting a usage requirement of a high frequency, the driver is required to have a characteristic of high instantaneous driving power, i.e. to have a large capacitive load capacity.

2. For meeting a usage requirement of a high voltage, the driver is required to have high withstand voltage capability and has an ultra-low isolation capacitance to reduce the interference of a high voltage bus part on a low voltage control side.

3. For meeting a usage requirement of a high-speed switching, the driver is required to have a fast response speed to improve safety of a protection switch transistor when an abnormal state occurs.

4. For meeting a higher power density design, the driver is required to have a function for direct processing of a Miller clamp, to simplify PCB layout and simple solutions.

5. The driver is required to have a suitable drive voltage, that is, a power supply is required to have a positive output voltage and a negative output voltage, and the positive output voltage and the negative output voltage do not have symmetrical output characteristics.

Therefore, it is desired to have a driver meeting the above characteristics. The driver provided in the present disclosure may improve operating efficiency and safety of the power device, and reduce cost as well.

Detailed illustration will be made to the present disclosure below with reference to the accompanying drawings and combining with embodiments.

FIG. 1 is a block diagram illustrating a driver for a power device according to an embodiment of the present disclosure. As illustrated in FIG. 1, the driver 20 for a power device includes: a voltage providing module, a short circuit/overcurrent protection module 201, a miller clamp module 202, a drive signal isolation module 203, an over-temperature protection module 204, and an under-voltage protection module 205.

Figure 2:
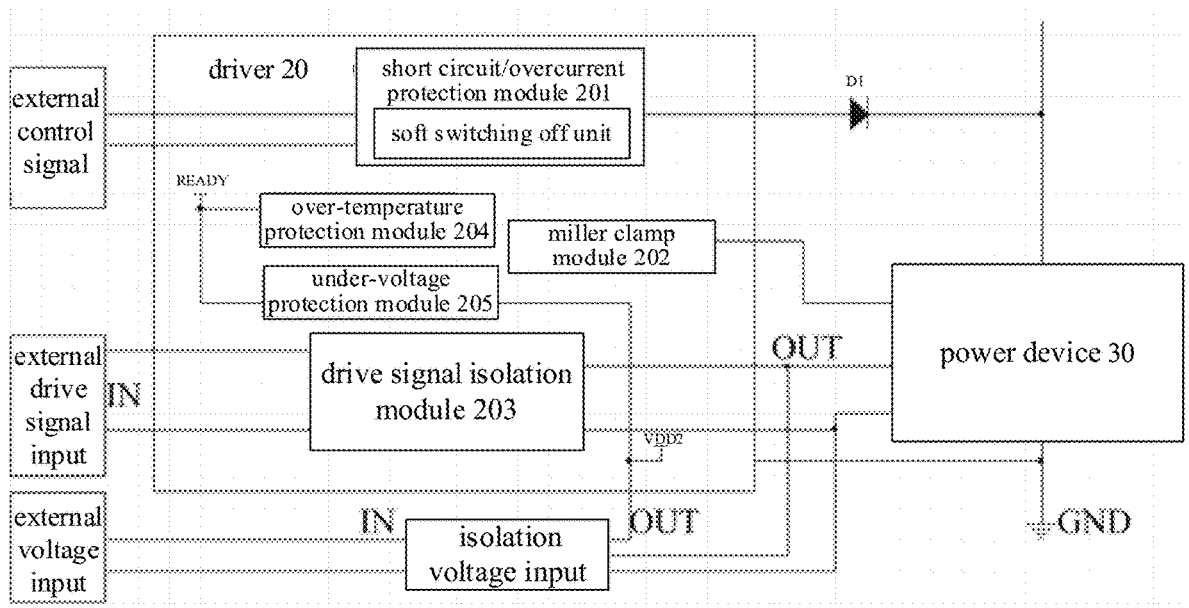
FIG. 2 is a block diagram illustrating a driver according to an embodiment of the present disclosure.

The voltage providing module is configured to provide a voltage required for the power device. In an embodiment of the present disclosure, the voltage providing module includes a DC-DC module. The DC-DC module includes a voltage input end and a voltage output end isolated with each other. The voltage input end is connected to an external voltage providing source. The voltage output end is connected to the power device. The DC-DC module 10 converts a voltage signal of the voltage input end to a suitable isolation voltage VDD2, provides a usable voltage signal for a secondary side of the driver, and provides a positive/negative voltage for the drive end of the power device. The DC-DC module 10 may be included in the driver 20. Alternatively, as illustrated in FIG. 2, another isolation voltage is provided to a secondary side of the driver 20 to provide VDD2 and the positive/negative input voltage for the control end of the power device 30.

Figures 1, 4:
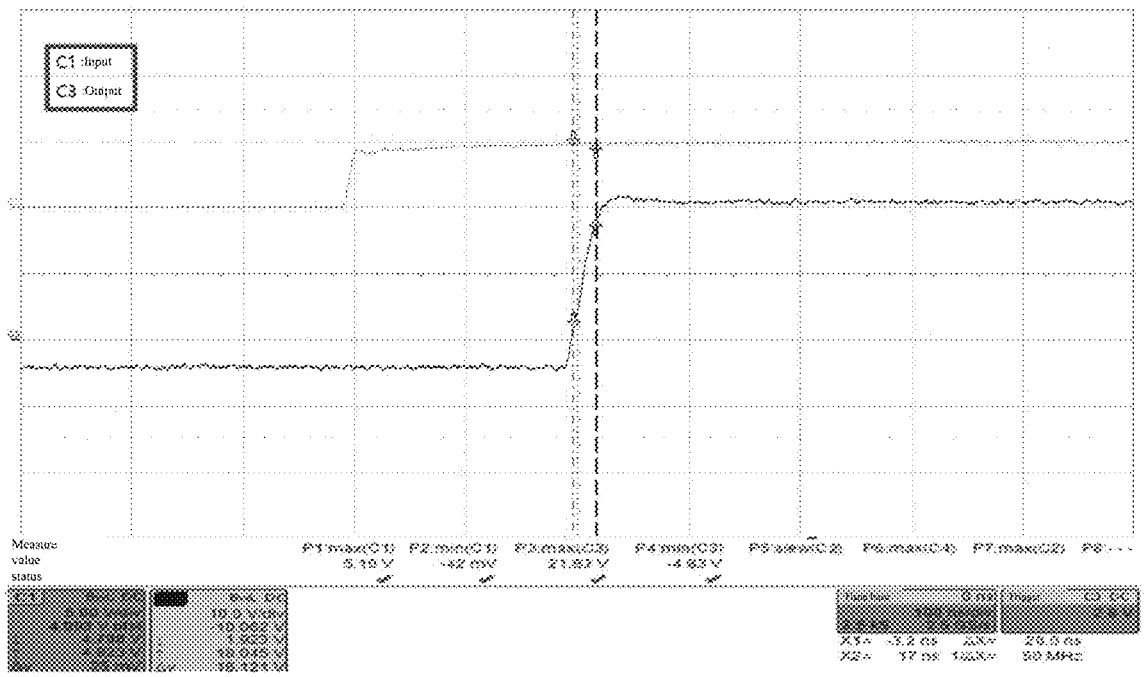
Figures 2, 4:
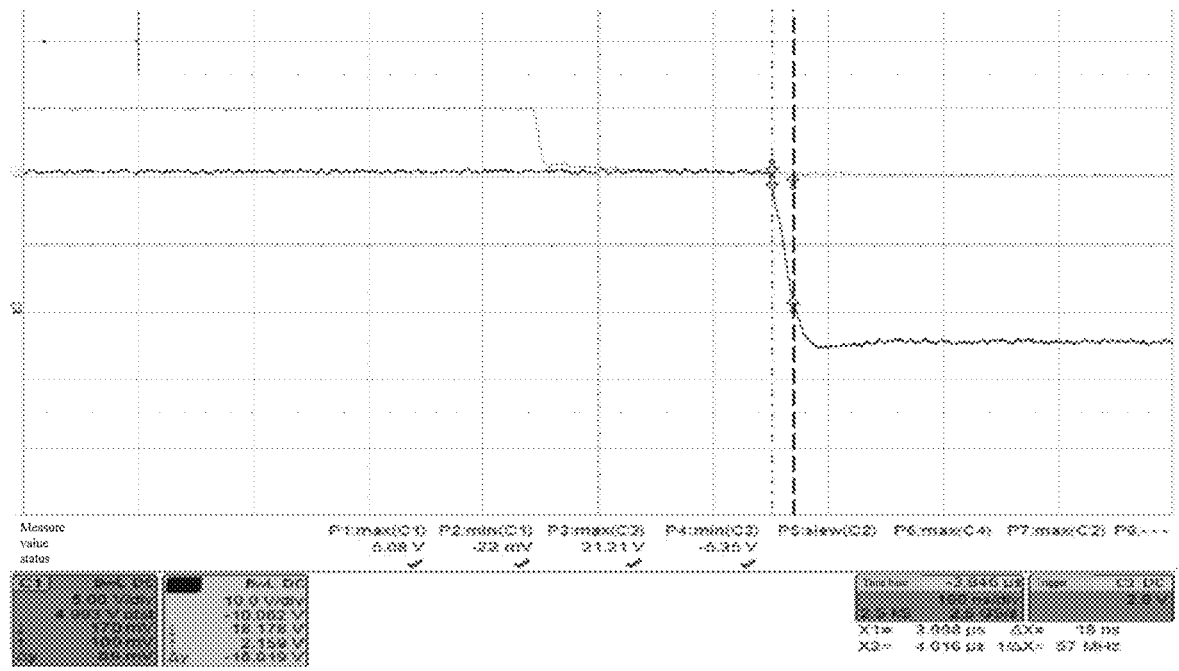

The driver 20 may be connected to the external voltage input end directly, a suitable VDD1 and a suitable REDAY signal may be provided to a primary side of the driver 20 via a power supply (such as, LDO), and a high level may be provided to an end F and an end R of the short circuit/overcurrent protection module, such that the primary side of the driver 20 may receive an input of an external drive signal. The end IN of the driver 20 receives a drive signal of a drive voltage signal ON/OFF. A signal output end OUT of the drive signal isolation module 203 of the driver 20 outputs a triggering signal to a control end G of the power device 30, and the DC-DC module 10 provides +20V to Ron, and −4V to Roff to drive the power device 30 to switch on or off, such that the power device 30 enters a normal operating state. As illustrated in FIGS. 4-1 and 4-2, after the driver outputs an on/off signal, parameters in the circuit change with the illustrated curve. A rise time period tr during switching on is 20 ns, and a fall time period tf during switching off is 18 ns.

The short circuit/overcurrent protection module 201 is connected to a drain electrode of the power device 30, and configured to switch off the power device when the short circuit or the overcurrent occurs for the power device.

In an embodiment of the present disclosure, the short circuit/over-current protection module 201 includes: a short circuit/overcurrent detection unit, a soft switching off unit, and a reset unit. The short circuit/overcurrent detection unit is configured to detect whether the short circuit or the overcurrent occurs for the power device. The soft switching off unit is configured to cut off an input of the signal input end when the power device is shorted or the overcurrent occurs, so as to suppress a generation of a high voltage peak of the power device. The reset unit is configured to receive a recovery signal inputted outside when the power device is shorted or the overcurrent occurs, to control the soft switching off unit to stop cutting off the input of the isolation drive signal.

In detail, a monitor end D of the short circuit/over-current protection module 201 is connected to the input end of the power device 30 via D1. A signal output end of the short circuit/over-current protection module 201 is connected to an output end F. A recovery end R of the short circuit/over-current protection module 201 is connected to an external control signal. When the short circuit or the overcurrent occurs for the power device 30, the monitor end D may detect that a large current passes, a protection function is triggered to start up, and a soft switching off function is started up simultaneously. Then a signal is provided to the output end F, the end F pulls down the power level quickly such that the power device may not be damaged due to a high short circuit/overcurrent peak, and an input signal of the drive signal isolation module 203 is cut off by the external control signal. After an abnormal state signal of the monitor end removes, the output end F recovers to the high level, the external control signal inputs a restart signal through an input end R of the short circuit/over-current protection module 201, and the input signal of the drive signal isolation module 203 is restarted, such that the power device 30 recovers to the normal operating state.

Figure 5:
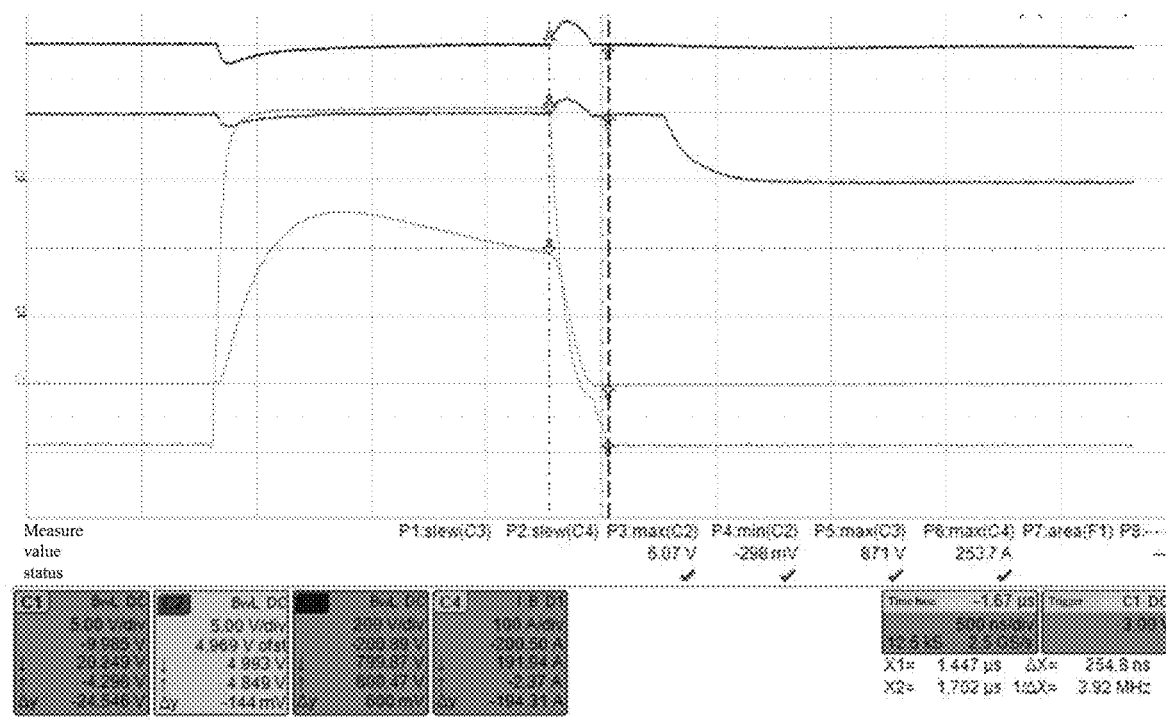
FIG. 5 is a waveform diagram in short circuit protection according to a detailed embodiment of the present disclosure.

In an embodiment of the present disclosure, the input end D of the short circuit/over-current protection module 201 is isolated with the output end F and the input end R. The end D of the short circuit/over-current protection module 201 is connected to the input end of the power device 30 though an isolation diode D1. When a short circuit signal is detected, as illustrated in FIG. 5, the external control signal outputs a protection signal, the drive signal is cut off, VDD2 is decreased from 5V to 0V, the end F outputs a low level, a short circuit time period is 1.5 1.5 us, a soft switching off time period tf is 254 nS, a bus voltage is 800V, and a short circuit peak is about 870V. When the short signal is released, the restart signal is provided by the end R, to drive the signal to start up.

The miller clamp module 202 is connected to a control end of the power device directly via R5, which may effectively remove an effect of a Miller platform on the drive voltage of the power device 30.

Figure 3:
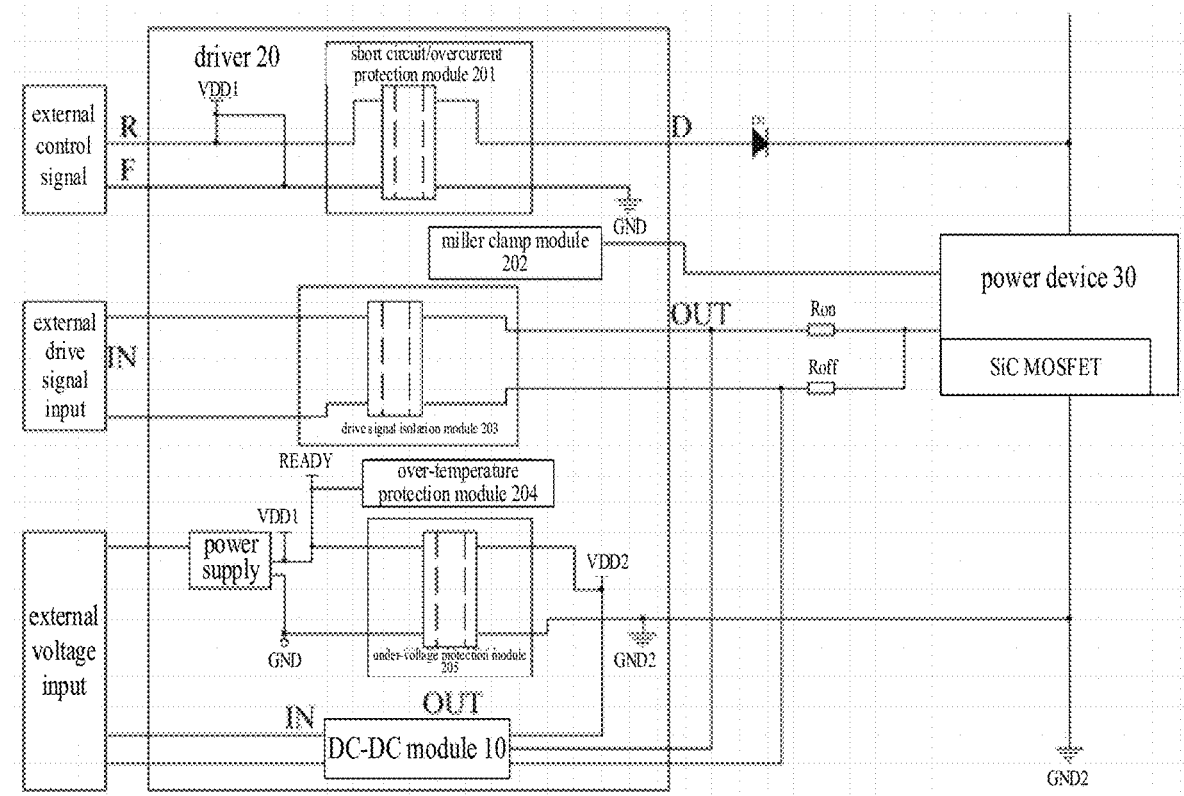
FIG. 3 is a block diagram illustrating a driver according to another embodiment of the present disclosure.

As illustrated in FIG. 3, in an embodiment of the present disclosure, an input end IN of the drive signal isolation module 203 of the driver 20 is isolated with an output end OUT of the drive signal isolation module 203 though a magnetic isolation device. In this way, an interference of a strong power signal of a power end on a weak point signal of the input end may be effectively avoided, and the safety of actual operators is improved significantly.

The over-temperature protection module 204 is connected to a node between the drive signal isolation module 203 and the power device 30, and configured to cut off the input of the isolation drive signal to the power device selectively according to a temperature of the driver 20. In an embodiment of the present disclosure, the over-temperature protection module 204 includes: a temperature detection unit and a drive signal switching off unit. In an embodiment of the present disclosure, an output end of the over-temperature protection module 204 is connected to the READY directly.

Figures 1, 7:
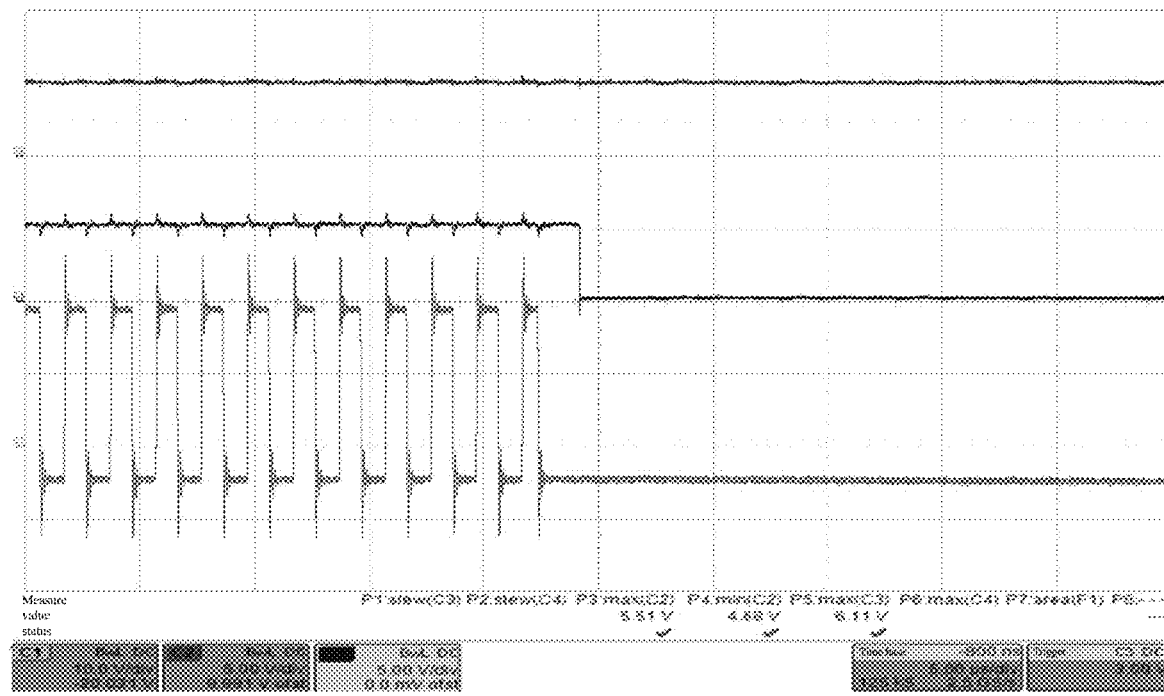
Figures 2, 7:
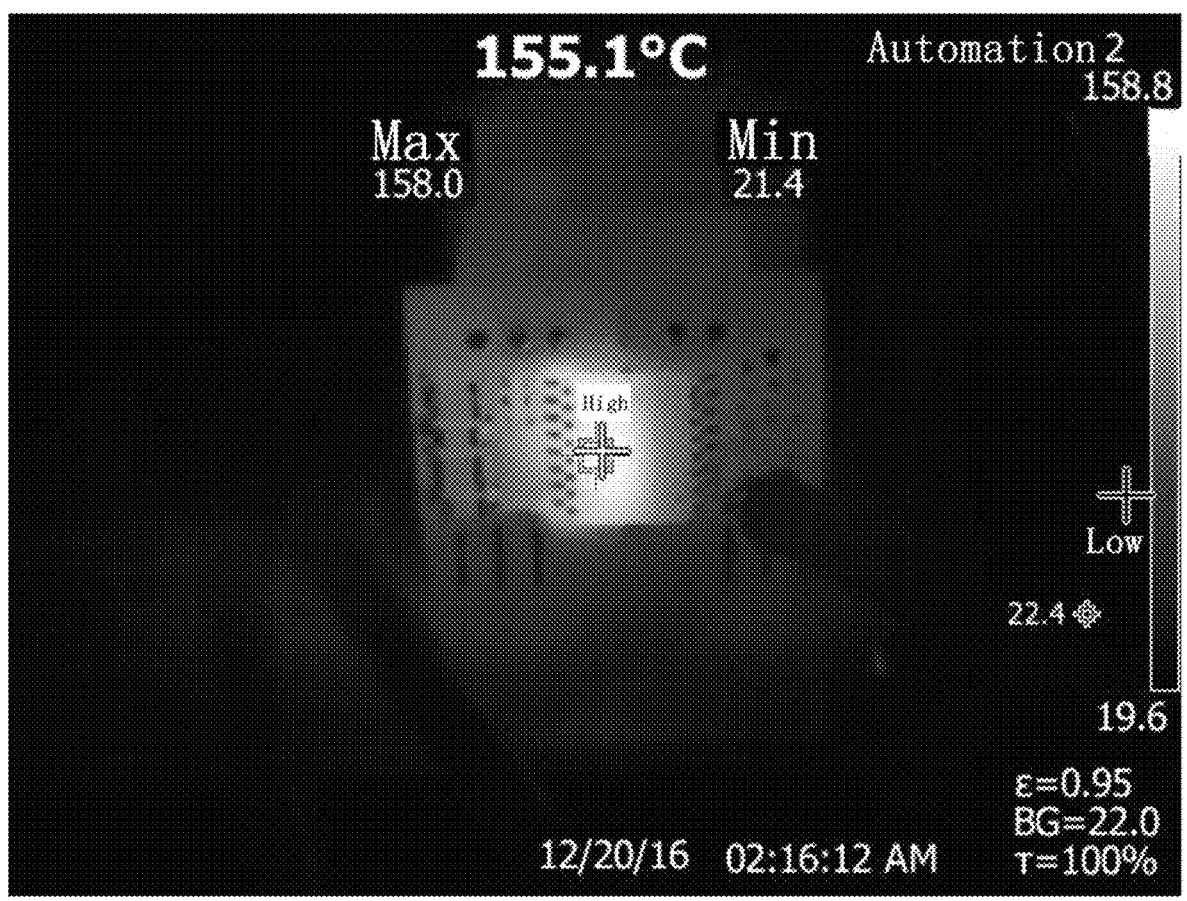

As illustrated in FIG. 7-2, an infrared camera is used to detect the driver in embodiments. When the temperature of the driver 20 is greater than 155° C., as illustrated in the waveform diagram of FIG. 7-1, the output end pulls down the READY signal and cuts off the input of the drive signal. When the temperature of the driver 20 is lower than 125° C., the READY signal will recover to a high level, and restart to receive the input of the drive signal.

Figure 6:
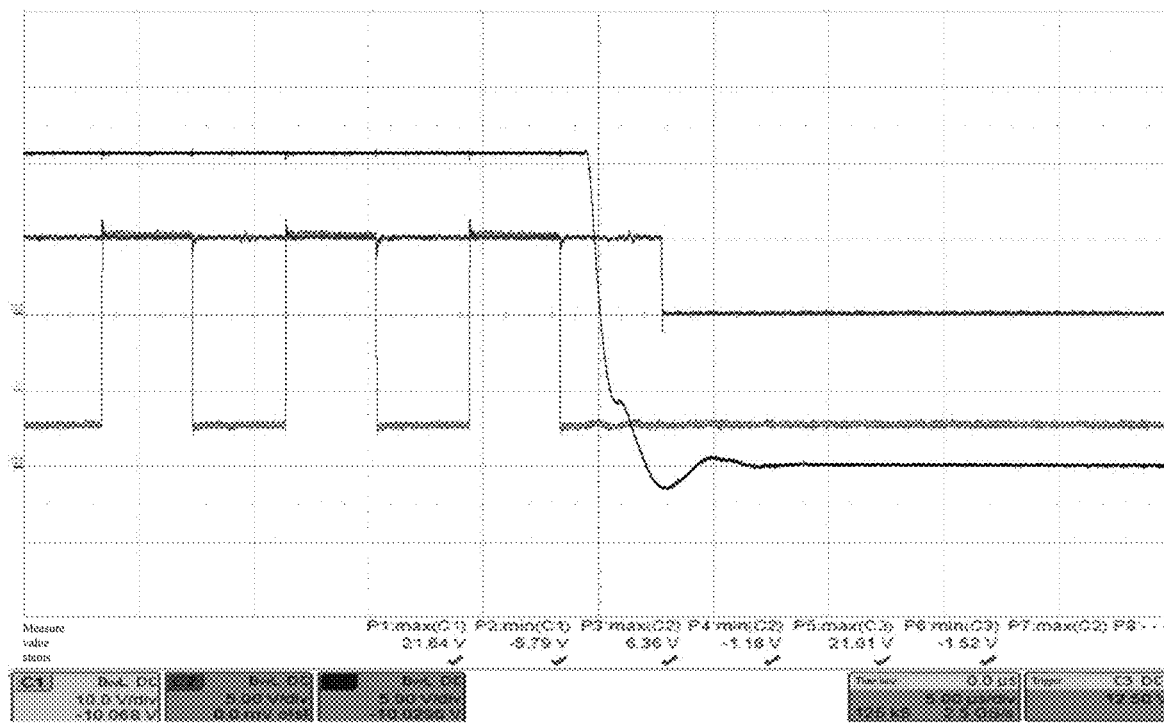
FIG. 6 is a waveform diagram in under-voltage protection according to a detailed embodiment of the present disclosure.

The under-voltage protection module 205 is connected to the node between the drive signal isolation module 203 and the power device 30, and configured to cut off an input of the isolation drive signal to the power device 30 when an input voltage is under voltage. When the input voltage of VDD2 is low, as illustrated in FIG. 6, the voltage of VDD2 is decreased from +20V to 11.1V, the output end decreases the READY signal to a low power level, and the input of the drive signal is cut off. When the voltage of VDD2 is greater than 11.5V, the READY signal recovers to a high level, and the drive signal isolation module 203 restarts to receive the input of the drive signal.

With the driver for the power device according to embodiments of the present disclosure, the drive signal isolation module 203 is connected to the control end of the power device 30 through the on/off resistor, and connected to the input end of the power device 30 though the isolation diode; the miller clamp module 202 is connected to the control end of the power device 30 directly; the drive signal isolation module 30 receives the drive signal via the input of the external voltage signal, and controls the signal output end to output the triggering signal to the power device 30 according to the drive signal, such that the power device 30 is switched on or off and operates in the normal operating state. When the short circuit/overcurrent protection module 201, the under-voltage protection module 205, and the over-temperature protection module 204 detect the abnormal signal, the signal is transmitted quickly, the input of the drive voltage signal is cut off timely to protect and the power device. When the abnormal state removes, the restart signal is received, such that the power device may recover to the normal operating state automatically. In this way, operating efficiency and reliability of the power device are improved, product competitiveness is improved, and the cost is reduced.

The above is only an optimal embodiment of the present disclosure, which does not limit to the present disclosure. All changes, alternatives and modifications within a spirit and principle of the present disclosure should be included in the scope of the present disclosure.

What is claimed is:

1. A driver for a power device, comprising:
 a voltage providing module, configured to provide a voltage required for the power device;
 a drive signal isolation module, comprising a signal input end and a signal output end isolated with each other, the signal input end being configured to receive an external drive signal, and the signal output end being connected to a control end of the power device and configured to provide an isolation drive signal for the power device;
 a short circuit/overcurrent protection module, connected to a drain electrode of the power device, and configured to cut off the power device when at least one of a short circuit and an overcurrent occurs for the power device;
 a miller clamp module, connected to a drive end of the power device, and configured to remove Miller effect;
 an under-voltage protection module, connected to a node between the drive signal isolation module and the power device, and configured to cut off an input of the isolation drive signal to the power device when an input voltage is under voltage; and
 an over-temperature protection module, connected to the node between the drive signal isolation module and the power device, and configured to cut off the input of the isolation drive signal to the power device selectively according to a temperature of the drivers;
 wherein the short circuit/over-current protection module comprises:
 a short circuit/overcurrent detection unit, configured to detect whether at least one of the short circuit and the overcurrent occurs for the power device;
 a soft switching off unit, configured to cut off an input of the signal input end when at least one of the short circuit and the overcurrent occurs for the power device, so as to suppress a generation of a high voltage peak of the power device, and
 a reset unit, configured to receive a recovery signal inputted outside when the short circuit or the overcurrent occurs for the power device, to control the soft switching off unit to stop cutting off the input of the isolation drive signal.

2. The driver of claim 1, wherein, the voltage providing module comprises:
 a DC-DC module, comprising a voltage input end and a voltage output end isolated with each other, the voltage input end being connected to an external voltage providing source, the voltage output end being connected to the power device, the DC-DC module being configured to convert an input voltage of an external voltage providing source to the voltage required for the power device.

3. The driver of claim 1, wherein, the drive signal isolation module further comprises:
 a magnetic isolation device, configured to isolate the signal input end and the signal output end.

4. The driver of claim 1, wherein, the over-temperature protection module comprises:
 a temperature detection unit, configured to detect the temperature of the driver; and a drive signal switching off unit, configured to cut off the input of the isolation drive signal for the power device selectively according to the temperature of the driver.

5. The driver of claim 1, wherein, the power device is at least one of a silicon carbide metal-oxide-semiconductor field-effect transistor and a gallium nitride high electron mobility transistor.

\* \* \* \* \*